(12) United States Patent
Veres et al.

(10) Patent No.: US 7,718,734 B2
(45) Date of Patent: May 18, 2010

(54) ORGANIC SEMICONDUCTING MATERIALS

(75) Inventors: Janos Veres, Manchester (GB); Paul Craig Brookes, Manchester (GB); Richard Thomas Williams, Manchester (GB); Simon Dominic Ogier, Manchester (GB); Soad Mohialdin-Khaffaf, Manchester (GB); Stephen William Leeming, Manchester (GB)

(73) Assignee: Merck Patent GmbH, Darmstadt (DE)

( * ) Notice: Subject to any disclaimer, the term of this patent is extended or adjusted under 35 U.S.C. 154(b) by 730 days.

(21) Appl. No.: 10/539,745

(22) PCT Filed: Dec. 18, 2003

(86) PCT No.: PCT/GB03/05521

§ 371 (c)(1),
(2), (4) Date: Feb. 28, 2006

(87) PCT Pub. No.: WO2004/057688

PCT Pub. Date: Jul. 8, 2004

(65) Prior Publication Data

US 2006/0155040 A1 Jul. 13, 2006

(30) Foreign Application Priority Data

Dec. 20, 2002 (GB) .................. 0229660.6
May 8, 2003 (GB) .................. 0310588.9

(51) Int. Cl.
*C08L 65/00* (2006.01)
(52) U.S. Cl. .......................... 525/88; 525/92 A; 525/89; 528/377; 528/422; 528/423
(58) Field of Classification Search ................ 525/88, 525/92 A, 89; 528/377, 422, 423
See application file for complete search history.

(56) References Cited

U.S. PATENT DOCUMENTS

| | | | |
|---|---|---|---|
| 6,309,763 B1 | 10/2001 | Woo et al. | |
| 6,605,323 B1 | 8/2003 | Wingen et al. | |
| 2001/0026878 A1 | 10/2001 | Woo et al. | |
| 2002/0058157 A1* | 5/2002 | Doi et al. .................. | 428/690 |
| 2004/0038459 A1 | 2/2004 | Brown et al. | |

FOREIGN PATENT DOCUMENTS

| | | |
|---|---|---|
| WO | WO 99/32537 A1 | 7/1999 |
| WO | WO 9954385 | 10/1999 |
| WO | WO 00/78843 A1 | 12/2000 |
| WO | WO 0245184 | 6/2002 |

OTHER PUBLICATIONS

I. Levesque et al. "Organic tunable electroluminescen tdiodes from polyfluorene derivatives" 2001, Synthetic Metals, vol. 122, pp. 79-81.*
Oshima Katsunori, Patent Abstract of Japan, JP 55-090953, Jul. 10, 1980, 5 pages.
Shijie Liao et al., Patent Abstract of China, CN 1589964 A, Mar. 9, 2005, 9 pages.
Helbig et al., Patent Abstract of Germany, DE 19832943 A1, Feb. 3, 2000, 20 pages.

* cited by examiner

*Primary Examiner*—Jeffrey C Mullis
(74) *Attorney, Agent, or Firm*—Millen, White, Zelano, Branigan, P.C.

(57) ABSTRACT

A composition for use as an organic semiconducting (OSC) material, the composition comprising: (i) at least one higher molecular weight organic semiconducting compound having a number average molecular weight ($M_n$) of at least 5000, and (ii) at least one lower molecular weight organic semiconducting compound having a number average molecular weight ($M_n$) of 1000 or less. Use of the composition in an electronic device, e.g. FET or OLED.

27 Claims, 3 Drawing Sheets

ORGANIC SEMICONDUCTING MATERIALS

The present invention relates to compositions for use as organic semiconducting (OSC) materials, to layers comprising the same e.g. for use in electronic devices, to methods for the production thereof, to uses thereof and to devices or apparatus comprising the compositions.

In recent years, there has been development of OSC materials in order to produce more versatile, lower cost electronic devices. OSC materials may comprise either small organic molecules or polymers. Such materials find application in a wide range of devices or apparatus, including in organic field effect transistors (OFETs), organic light emitting diodes (OLEDs), photodetectors, photovoltaic (PV) cells, and as organic photoconductors (OPCs) in electrophotographic devices, to name just a few.

In many applications for OSC materials there is a need for increased charge carrier mobility which can lead to faster and/or more efficient devices.

Objects of the present invention include providing OSC materials of improved mobility, as well as improved devices using the OSC materials. Other objects will be apparent from the description.

Surprisingly, the inventors have found that mixtures of organic semiconducting compounds having certain different molecular weights have charge carrier mobilities greater than either of the individual compounds. This is surprising because previously it has been thought that by mixing two different semiconducting compounds, which would each have a different HOMO level, it would inevitably lead to charge trapping on one of the compounds, thereby reducing the mobility (see Yokoyama and Yokoyama J. Appl. Phys. 67 (6) 1990; Pai et al, J. Phys. Chem. 88, p 4714, 1984; Veres and Juhasz, Phil. Mag. B, Vol. 75, No. 3, pp. 377-387, 1997).

According to a first aspect of the present invention there is provided a composition for use as a OSC material, the composition comprising:

(i) at least one higher molecular weight organic semiconducting compound having a number average molecular weight ($M_n$) of at least 5000, and (ii) at least one lower molecular weight organic semiconducting compound having a number average molecular weight ($M_n$) of 1000 or less.

Preferably the $M_n$ of the higher molecular weight semiconducting compound is at least 7000. Preferably the $M_n$ of the lower molecular weight semiconducting compound is at least 150.

Compositions which observe these molecular weight differences have been found to have increased charge carrier mobility compared to either of the higher or lower molecular weight compounds individually. In some cases, the mobility is found to double.

The higher and lower molecular weight semiconducting compounds are transporters of the same type of charge carrier as each other. That is, the compounds are either each so-called "p-type" compounds which can transport positively charged holes, or each so-called "n-type" compounds which can transport negatively charged electrons, the resultant composition being either p-type or n-type respectively.

The higher and lower molecular weight compounds are both semiconducting compounds. Preferably at least one, more preferably both, of the higher and lower molecular weight semiconducting compounds have a charge carrier mobility, $\mu$, of at least $10^{-5}$ cm$^2$/V.s, more preferably at least $10^{-4}$ cm$^2$/V.s. Preferably, at least the higher molecular weight semiconducting compound has a charge carrier mobility of at least $10^{-5}$ cm$^2$/V.s, more preferably at least $10^{-4}$ cm$^2$/V.s.

Preferably, the higher and lower molecular weight semiconducting compounds are present in the composition in the relative proportions 10:90-90:10 parts by weight; more preferably 30:70-70:30 parts by weight; even more preferably 40:60-60:40 parts by weight; and most preferably about 50:50 parts by weight.

The lower molecular weight compound may comprise either an oligomer typically having a number of repeat units, n, in the range 2-15 depending on the type of repeat unit, or a non-oligomeric small molecule (i.e. a monomer, where n=1). Where the lower molecular weight compound comprises an oligomer, more typically n is in the range 2-5. Preferably, the lower molecular weight compound is either an oligomer wherein n=2 or 3 (i.e. dimer or trimer respectively) or a non-oligomeric small molecule wherein n=1 (i.e. a monomer). The term polymer will be used herein to define any compound comprising a number (>1) of repeating units. The term oligomer as aforementioned is additionally used herein to define polymers having a small number of repeating units (typically 15 or less). Polymers (including oligomers) herein may be either monodisperse or polydisperse.

Preferably, the higher molecular weight semiconducting compound comprises a polymer, more preferably a π conjugated polymer. The polymer typically has a number of repeat units, n, which is 5 or higher, preferably 10 or higher, more preferably 15 or higher and most preferably 20 or higher depending on the type of repeat unit. The polymer may be substantially linear, or may have a degree of chain branching or may contain crosslinking. The polymer may be either monodisperse or polydisperse.

The higher molecular weight semiconducting compound may, for example, have an $M_n$ of up to $1.5 \times 10^6$. The $M_n$ may be higher still.

Preferably, the higher and lower molecular weight semiconducting compounds are of a similar chemical class. In a preferred embodiment, the higher molecular weight compound contains one or more chemical groups the same as or similar to groups contained in the lower molecular weight compound. For example, preferably the higher and lower molecular weight semiconducting compounds each contain one or more of the following groups in common: arylamine, fluorene and/or thiophene groups. More preferred among these groups is arylamine, even more preferred being triarylamine. Additionally or alternatively, the higher and lower molecular weight semiconducting compounds may contain the same or similar repeat units as each other.

Preferred classes of compounds for the lower molecular weight semiconducting compound are those containing arylamine, fluorene, and/or thiophene groups, more preferably arylamine, still more preferably triarylamine. A particularly preferred class of compound for the lower molecular weight semiconducting compound are arylamine group containing compounds having Formula 1:

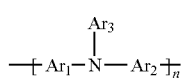

Formula 1 wherein $Ar^1$, $Ar^2$ and $Ar^3$, which may be the same or different, each represent, independently if in different repeat units, an aromatic group (mononuclear or polynuclear) optionally substituted by at least one optionally substituted $C_{1-40}$ hydrocarbyl group and/or at least one other optional substituent and n=1 to 4, preferably 1 to 3 and more preferably 1 or 2. In the context of $Ar^1$, $Ar^2$ and $Ar^3$, a mononuclear aromatic group has only one aromatic ring, for example phenyl or phenylene. A polynuclear aromatic group has two or more aromatic rings which may be fused (for example napthyl or naphthylene), individually covalently linked (for example biphenyl) and/or a combination of both fused and individually linked aromatic rings. Preferably each $Ar^1$, $Ar^2$ and $Ar^3$ is an aromatic group which is substantially conjugated over substantially the whole group.

Examples of compounds of Formula 1 are given below as Formulae 2A-O:

| Formula no. | Compound |
|---|---|
| 2A | |
| 2B | |
| 2C | |

-continued
| Formula no. | Compound |
|---|---|
| 2D | 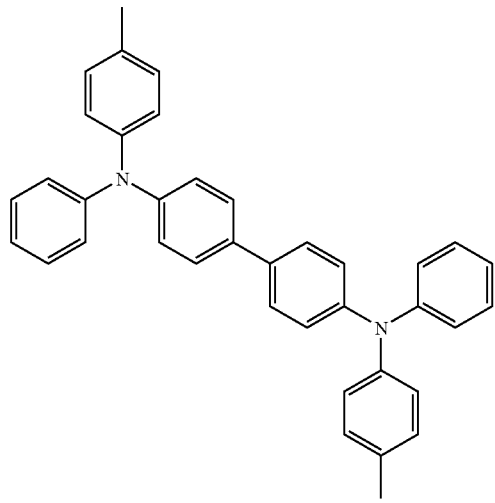 |
| 2E | 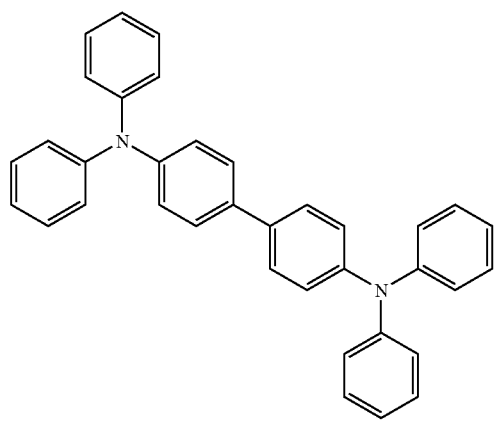 |
| 2F | 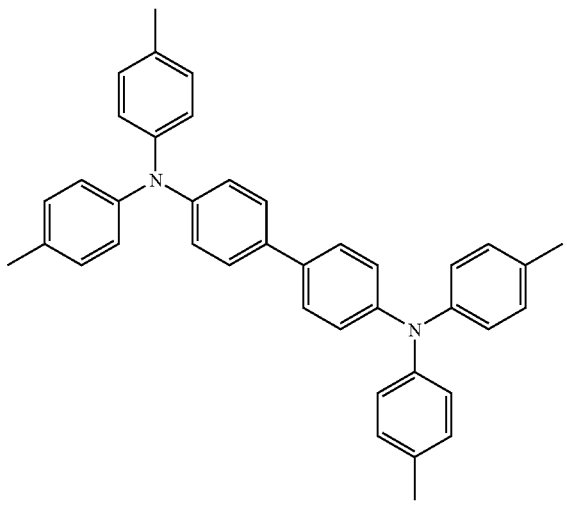 |

| Formula no. | Compound |
|---|---|
| 2G | *(chemical structure: tri-p-tolylamine)* |
| 2H | *(chemical structure: N,N-diphenyl-N-phenylamine repeating unit, with H—[...]₃—H)* |
| 2I | *(chemical structure: 9,9-dimethylfluorenyl-di-p-tolylamine)* |
| 2J | *(chemical structure: N-(p-tolyl)-di-1-naphthylamine)* |
| 2K | *(chemical structure: N,N-di-p-tolyl-fluoren-2-amine)* |

| Formula no. | Compound |
|---|---|
| 2L | (structure) |
| 2M | (structure) |
| 2N | (structure) |
| 2O | (structure) |

Other suitable lower molecular weight semiconducting compounds may comprise monomers where n=1 or oligomers (including cooligomers) where n=2-10, preferably n=2-3, of the following structures of formulae 3-9:

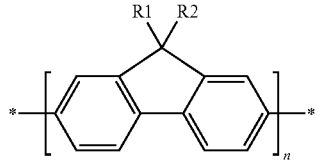

Formula 3

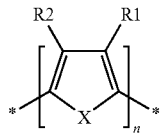

Formula 4 where R1 and R2 may be independently may be independently H; optionally substituted alkyl; alkoxy; thioalkyl; acyl; optionally substituted aryl; a fluorine atom; a cyano group; a nitro group; an optionally substituted secondary or tertiary alkylamine or arylamine —N($R_4$)($R_5$), where $R_4$ and $R_5$ may each be independently represented by H, alkyl, substituted alkyl, aryl, substituted aryl, alkoxy or polyalkoxy groups; or other substituent and * is any terminal or end capping group including hydrogen. The alkyl and aryl groups may be optionally fluorinated.

in which X may be Se, Te or preferably O, S or —N(R)—, where R represents H, alkyl, substituted alkyl, aryl, or substituted aryl; R1 and R2 are as for formula 3. The alkyl and aryl groups may be optionally fluorinated.

Formula 5

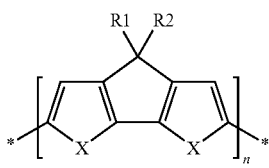

in which X, R1 and R2 are as for formula 3.

Formula 6

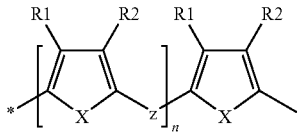

in which X is as for formula 4; R1, R2 are as for formula 3; and Z represents —C(T$_1$)=C(T$_2$)-, —C≡C—, —N(R')—, —N=N—, (R')=N—, —N=C(R')—, T$_1$ and T$_2$ independently represent —H, Cl, F, —C≡N or a lower alkyl, R' represents —H, alkyl, substituted alkyl, aryl, or substituted aryl. The alkyl and aryl groups may also be optionally fluorinated.

Formula 7

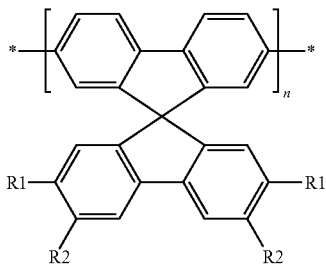

where R1 and R2 are as for formula 3. The alkyl and aryl groups may be optionally fluorinated.

Formula 8

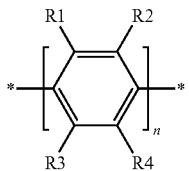

where R1-R4 may be independently selected from the same list of groups as for R1 and R2 in formula 3.

Formula 9

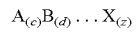

where the monomer is an anilino monomer unit, the groups Ar', Ar" and Ar'" being optionally substituted aryl groups in which the aryl groups may be phenyl groups and Ar'" may be substituted (e.g. o- or p-substituted) with a group which has an electron withdrawing or donating effect.

Preferred classes of compounds for the higher molecular weight semiconducting compound include those containing substantially π-conjugated repeat units. The higher molecular weight semiconducting compound may be a homopolymer or copolymer (including a block-copolymer) of the general formula 10:

$$A_{(c)}B_{(d)}\ldots X_{(z)}$$  Formula 10 where A, B, . . . , Z each represent a monomer unit and (c), (d), . . . (z) each represent the fraction of the respective monomer unit in the polymer, i.e. each (c), (d), . . . (z) is a value from 0 to 1 and the total of (c)+(d)+ . . . +(z)=1. Examples of monomer units A, B, . . . Z include units of formulae 3-9 given above. In the case of a block-copolymer, each monomer A, B, . . . Z may be a conjugated oligomer or polymer comprising a number, for example 2 to 50, of the units of formulae 3-9. The higher molecular weight semiconducting compound preferably includes arylamine, fluorene, thiophene, spiro bifluorene and/or optionally substituted aryl (e.g. phenylene) groups, more preferably arylamine, still more preferably triarylamine. The aforementioned groups may be linked by further conjugating groups e.g. vinylene. Additionally preferably the higher molecular weight semiconducting compound comprises a polymer (either a homopolymer or copolymer, including block-copolymer) containing one or more of the aforementioned arylamine, fluorene, thiophene and/or optionally substituted aryl groups. A preferred higher molecular weight compound comprises a homo-polymer or copolymer (including block-copolymer) containing arylamine (preferably triarylamine) and/or fluorene units. Another preferred higher molecular weight compound comprises a homo-polymer or co-polymer (including block-copolymer) containing fluorene and/or thiophene units. Examples of copolymers for the higher molecular weight compound are given below:

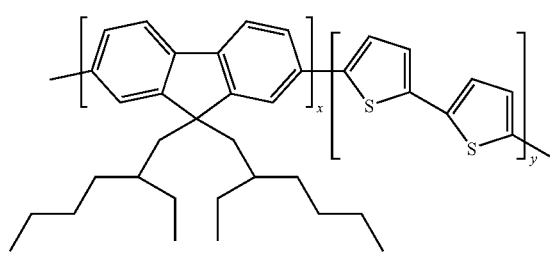

copolymer example i

-continued copolymer example ii

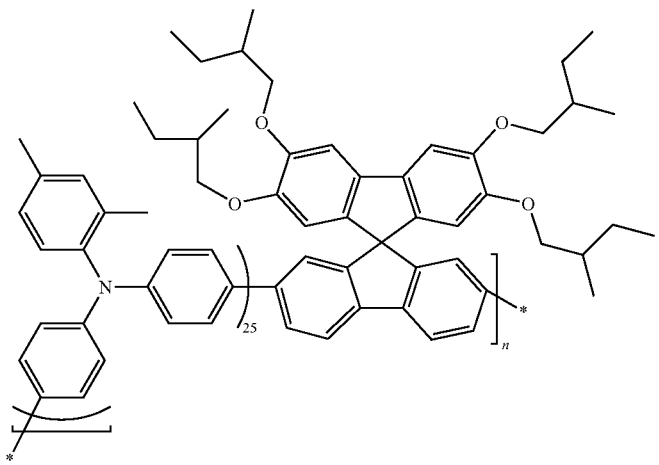

A particularly preferred class of compound for the higher molecular weight semiconducting compound are arylamine group containing polymers having the same general Formula 1 as above except that n is at least 5, preferably at least 10, more preferably at least 15 and most preferably at least 20. Such compounds are denoted herein as Formula 11. Examples of series of compounds of Formula 11 have formula 11A-C, where n is at least 15.

Formula 11A

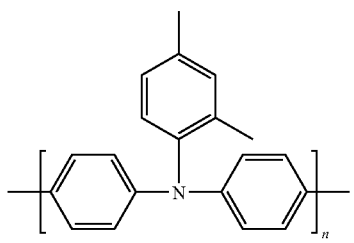

Formula 11B

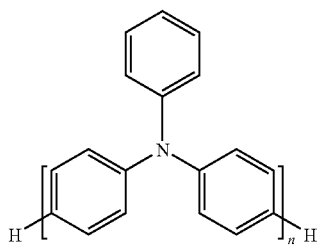

Formula 11C

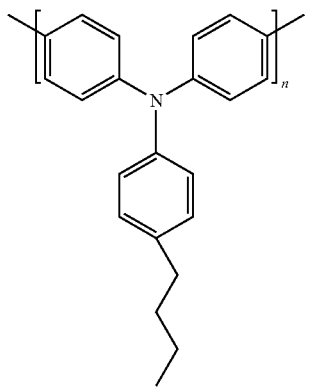

Compounds of Formulae 1 and 11 may be prepared by various methods including those described in WO 99/32537 and WO 00/78843 the contents of which are hereby incorporated by reference.

Particularly preferred compositions, according to the present invention, contain at least one compound of Formula 1 (preferably where n=1 or 2) as the lower molecular weight compound and at least one compound of Formula 11 (preferably where n is at least 20) as the higher molecular weight compound. More particularly preferred compositions are those wherein the compounds of Formulae 1 and 11 as aforementioned are provided in the relative proportions 40:60-60:40 parts by weight.

Advantageously, such compositions according to the present invention may exhibit improved carrier mobility, good solubility for solution coating techniques, compatibility with binders, and/or high durability.

The composition according to the invention may be prepared by a process which comprises mixing both the at least one higher molecular weight compound and the at least one lower molecular weight compound together in a solvent. The solvent may be one solvent or the higher and lower molecular weight compounds may each be dissolved in a separate solvent followed by mixing the two resultant solutions to mix the compounds. The solvent(s) containing the compounds may then be applied to a substrate. The solvent(s) may be evaporated to form the composition.

Preferably the composition according to the present invention and/or the individual higher and lower molecular weight compounds making up the composition may be deposited from a solvent. The solvent may be evaporated to form the composition. Preferably the composition and/or the individual higher and lower molecular weight compounds making up the composition are soluble in the solvent. Preferably the composition and the individual higher and lower molecular weight compounds making up the composition are soluble in a wide range of organic solvents, e.g. without limitation, toluene, THF, ethyl acetate, dichloromethane, chlorobenzene, anisole, xylene. Thus, the composition may be applied to a substrate as part of a device manufacture by various types of solution coating. The composition can be applied to a substrate by a variety of coating or printing techniques such as dip coating, roller coating, reverse roll coating, bar coating, spin coating, gravure coating, lithographic coating (including photolithographic processes), ink jet coating (including continuous and drop-on-demand, and fired by piezo or thermal processes), screen coating, spray coating and web coating. The composition may be deposited as a layer or film.

In one embodiment, the higher molecular weight compound may be deposited on a substrate first (e.g. by a form of solution coating), followed by depositing (e.g. by a form of solution coating the same as or different to the first) a coating of the lower molecular weight compound and allowing the lower molecular weight compound to diffuse into the higher molecular weight compound to form the composition, or vice versa.

The invention also provides the use of the composition in an electronic device. The composition may be used as a high mobility semiconducting material in various devices and apparatus. The composition may be used, for example, in the form of a semiconducting layer or film. Accordingly, in another aspect, the present invention provides a layer for use in an electronic device, the layer comprising the composition according to the first aspect of the invention. The layer or film may be less than about thirty microns. For various electronic device applications, the thickness may be less than about one micron thick. The layer may be deposited, e.g. on a part of an electronic device, by any of the aforementioned solution coating or printing techniques.

The composition may be used, e.g. as a layer or film, in a field effect transistor (FET) e.g. as the semiconducting channel, organic light emitting diode (OLED) e.g. as a hole or electron injection or transport layer or electroluminescent layer, photodetector, chemical detector, photovoltaic cell (PVs), capacitor, memory and the like. The composition may also be used in electrophotographic (EP) apparatus, e.g. in the organic photoconductor. The composition is preferably solution coated to form a layer or film in the aforementioned devices or apparatus to provide advantages in cost and versatility of manufacture. The improved charge carrier mobility of the composition of the present invention enables such devices or apparatus to operate faster and/or more efficiently.

It will be appreciated that compositions of the invention may be formulated differently according to the end use, with different amounts of the composition and/or additional ingredients. Compositions of the present invention may be used in combination with any diluent, for example at least one binder resin and/or another OSC material.

The composition may be used in conjunction with a binder resin to further improve film formation and/or adjust viscosity for improving solution coatability. The binder may also be optionally crosslinked for improved stack integrity of layers. Preferred binders are electrical insulators. Preferred binders include, without limitation, at least one of polyamide, polyurethane, polyether, polyester, epoxy resin, polyketone, polycarbonate, polysulphone, vinyl polymer (for example polyvinylketone and/or polyvinylbutyral), polystyrene, polyacrylamide, copolymers thereof (such as aromatic copolymeric polycarbonate polyesters) and/or compositions thereof. Further suitable binders are disclosed in WO 02/45184.

The definitions of various terms used herein will now be explained.

As used herein, n is the number of repeat units which may be present in a particular polymer or oligomer.

In any of the polymeric or oligomeric formulae given herein, the polymer or oligomer may have any terminal or end capping groups, including hydrogen.

The term "at least one" in the context of "at least one higher molecular weight semiconducting compound" or "at least one lower molecular weight semiconducting compound" should be clearly understood to mean that there may be present two or more higher molecular weight semiconducting compounds and/or two or more lower molecular weight semiconducting compounds in the composition.

Where one or more of the aromatic groups $Ar^1$, $Ar^2$ and $Ar^3$ in Formulae 1 and 2 are optionally substituted by at least one optionally substituted $C_{1-40}$ hydrocarbyl group, the $C_{1-40}$ hydrocarbyl group preferably is a $C_{1-10}$ hydrocarbyl group, more preferably is a $C_{1-4}$ hydrocarbyl group. Additionally preferably said hydrocarbyl group is an optionally substituted alkyl group. Most preferred for the optionally substituted $C_{1-40}$ hydrocarbyl group is an optionally substituted $C_{1-4}$ alkyl group.

When in the formulae herein there is a list of labels (e.g. $Ar^1$, $Ar^2$ and $Ar^3$) or indices (e.g. 'n') which are said to represent a list of groups or numerical values, and these are said to be "independent in each case" this indicates each label and/or index can represent any of those groups listed independently from each other, independently within each repeat unit, independently within each Formula and/or independently on each group which is substituted as appropriate. Thus, in each of these instances, many different groups might be represented by a single label (e.g. $Ar^1$).

The terms 'substituent', 'substituted', 'optional substituent' and/or 'optionally substituted' as used herein (unless followed by a list of other substituents) signifies at least one of the following groups (or substitution by these groups): sulpho, sulphonyl, formyl, amino, imino, nitrilo, mercapto, cyano, nitro, halo, $C_{1-4}$alkyl, $C_{1-4}$alkoxy, hydroxy and/or combinations thereof. These optional groups may comprise all chemically possible combinations in the same group and/or a plurality (preferably two) of the aforementioned groups (e.g. amino and sulphonyl if directly attached to each other represent a sulphamoyl radical). Preferred optional substituents comprise: any of $C_{1-4}$alkyl, methoxy and/or ethoxy (any of these optionally substituted by at least one halo); and/or amino (optionally substituted by at least one methyl and/or ethyl); and/or halo.

The term 'hydrocarbyl' as used herein denotes any radical moiety which comprises at least one hydrogen atom and at least one carbon atom. A hydrocarbyl group may however be optionally substituted. Preferably, 'hydrocarbyl' groups comprise at least one of the following carbon containing moieties: alkyl, alkoxy, alkanoyl, carboxy, carbonyl, formyl and/or combinations thereof; optionally in combination with at least one of the following heteroatom containing moieties: oxy, thio, sulphinyl, sulphonyl, amino, imino, nitrilo and/or combinations thereof. More preferred hydrocarbyl groups comprise at least one: alkyl and/or alkoxy (optionally substituted with at least one halo).

The term 'alkyl' as used herein may be readily replaced, where appropriate, by terms denoting a different degree of saturation and/or valence e.g. moieties that comprise double bonds, triple bonds, and/or aromatic moieties (e.g. alkenyl, alkynyl and/or aryl) as well as multivalent species attached to two or more substituents (such as alkylene).

The term 'halo' as used herein signifies fluoro, chloro, bromo and iodo.

Any radical group or moiety mentioned herein (e.g. as a substituent) refers to a monovalent radical unless otherwise stated or the context clearly indicates otherwise (e.g. an alkylene moiety is bivalent and links two other moieties). Unless the context clearly indicates otherwise, a group herein which comprises a chain of three or more atoms signifies a group in which the chain wholly or in part may be linear, branched and/or form a ring (including spiro and/or fused rings).

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprise", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

DETERMINATION OF THE FIELD EFFECT MOBILITY

Figure 1:
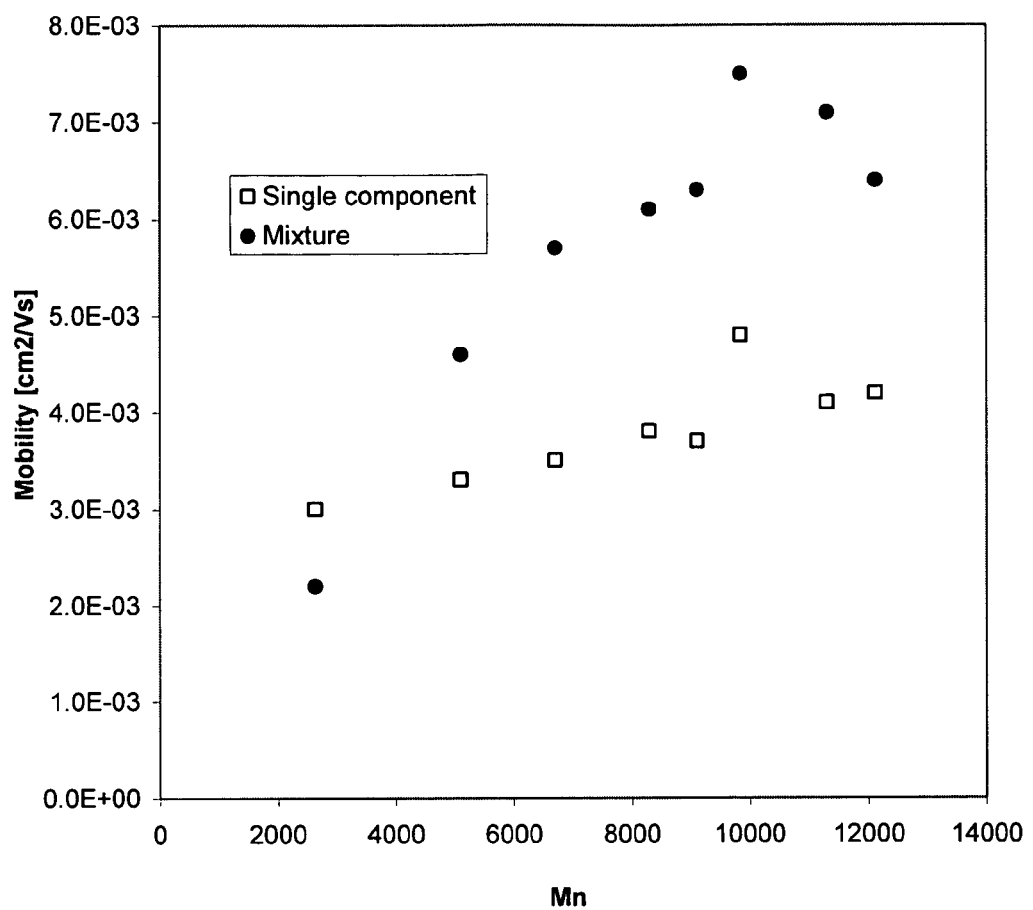
FIG. 1 shows charge carrier mobility of mixtures according to Example 3.

The field effect mobility of the materials was tested using the techniques described by Holland et al, J. Appl. Phys. Vol. 75, p. 7954 (1994).

In the following examples the test field effect transistors (FETs) were prepared on pre-patterned Pt/Pd source and drain electrodes on a polyester substrate. The channel length (L) (=distance between the electrodes) was 100 μm and the channel width (W) was 36 mm. The semiconductor composition according to the present invention (mixture of high and low molecular weight compounds) was dissolved one part into 99 parts of solvent, typically toluene, and spin coated onto the substrate at 1000 rpm for 20 s to yield a ~100 nm film. To ensure complete drying the sample was placed in an oven for 20 minutes at 100° C. A solution of a low permittivity perfluoropolymer, Cytop107M (Asahi Glass, Z-1700E01) was then spin-coated onto the semiconductor giving a thickness typically in the range 0.5 μm to 1 μm. The sample was placed once more in an oven at 100° C. to evaporate solvent from the insulator. A gold gate contact was defined over the device channel area by evaporation through a shadow mask. To determine the capacitance of the insulator layer a number of devices were prepared which consisted of a non-patterned Pt/Pd base layer, an insulator layer prepared in the same way as that on the FET device, and a top electrode of known geometry. The capacitance was measured using a hand-held multimeter, connected to the metal either side of the insulator.

The voltages applied to the transistor are relative to the potential of the source electrode. In the case of a p type gate material, when a negative potential is applied to the gate, positive charge carriers (holes) are accumulated in the semiconductor on the other side of the gate insulator. (For an n channel FET, positive voltages are applied). This is called the accumulation mode. The capacitance/area of the gate insulator $C_i$ determines the amount of the charge thus induced. When a negative potential $V_{DS}$ is applied to the drain, the accumulated carriers yield a source-drain current $I_{DS}$ which depends primarily on the density of accumulated carriers and, importantly, their mobility in the source-drain channel. Geometric factors such as the drain and source electrode configuration, size and distance also affect the current. Typically a range of gate and drain voltages are scanned during the study of the device. The source-drain current is described by equation 1.

$$I_{DS} = \frac{\mu W C_i}{L}\left((V_G - V_0)V_{DS} - \frac{V_{DS}^2}{2}\right) + I_\Omega \qquad \text{eq. 1}$$

where $V_0$ is an offset voltage and $I_\Omega$ is an ohmic current independent of the gate voltage and is due to the finite conductivity of the material. The other parameters have been described above.

For the electrical measurements the transistor sample was mounted in a sample holder. Microprobe connections were made to the gate, drain and source electrodes using Karl Suss PH100 miniature probe-heads. These were linked to a Hewlett-Packard 4155B parameter analyser. The drain voltage was set initially at −2V and the gate voltage was scanned from +20 to −40 V in 1 V steps, following this $V_D$ was set to −20V and for a second time the gate was scanned from +20V to −40V. When $|V_G|>|V_{DS}|$ the source-drain current varies linearly with $V_G$. Thus the field effect mobility can be calculated from the gradient (S) of $I_{DS}$ vs. $V_G$ given by equation 2.

$$S = \frac{\mu W C_i V_{DS}}{L} \qquad \text{eq. 2}$$

All field effect mobilities quoted below were calculated from this regime (unless stated otherwise).

Example 1

Mixtures 1-6 were made from the high molecular weight and low molecular weight compounds listed in Table 1 (50:50 parts by weight). The mobilities of the resultant mixtures are given, together with the % increase over the single component. It can be seen that substantial mobility increases are obtained with the mixtures and in the case of mixtures 3 and 5 the mobility more than doubled. The experiment tested compounds of formula 11A up to molecular weight of about 19000 which all showed the effect of increased mobility.

TABLE 1

| Mixture no. | High mol. wt. compound (mobility, cm²/V·s) | Low mol. wt compound (mobility, cm²/V·s) | Mobility of mixture | % increase in mobility* |
|---|---|---|---|---|
| 1 | Formula 11A, Mn = 17300 ($4.0 \times 10^{-3}$) | Formula 2C, Mn = 542 ($3.2 \times 10^{-4}$) | $6.0 \times 10^{-3}$ | 50 |
| 2 | Formula 11A, Mn = 17300 ($4.0 \times 10^{-3}$) | Formula 2A, Mn = 514 ($3.7 \times 10^{-4}$) | $7.3 \times 10^{-3}$ | 83 |
| 3 | Formula 11A, Mn = 17300 ($4.0 \times 10^{-3}$) | Formula 2J, Mn = 359 ($1.0 \times 10^{-3}$) | $8.8 \times 10^{-3}$ | 120 |
| 4 | Formula 11A, Mn = 17300 ($4.0 \times 10^{-3}$) | Formula 2I, Mn = 389 ($1.0 \times 10^{-3}$) | $7.3 \times 10^{-3}$ | 83 |
| 5 | Formula 11A, Mn = 19100 ($3.2 \times 10^{-3}$) | Formula 2A, Mn = 514 ($3.7 \times 10^{-4}$) | $7.0 \times 10^{-3}$ | 118 |
| 6 | Formula 11A, Mn = 10200 ($2.9 \times 10^{-3}$) | Formula 2A, Mn = 514 ($3.7 \times 10^{-4}$) | $5.3 \times 10^{-3}$ | 83 |

*compared against mobility of high molecular weight component on its own

Example 2

The further Mixtures in Table 2 were made up using the high molecular weight material of Formula 11A Mn=17300 and the various low molecular weight compounds listed (50:50 parts by weight). The % increases in the mobility of the resultant mixtures compared with the mobility of the high molecular weight component on its own are given.

TABLE 2

| Mixture no. | Low molecular weight compound | Percentage Increase from Formula 11A Mn = 17300 |
|---|---|---|
| 7 | Formula 2B Mn = 588 | 39% |
| 8 | Formula 2D Mn = 516 | 37% |
| 9 | Formula 2E Mn = 488 | 64% |
| 10 | Formula 2F Mn = 544 | 17% |
| 11 | Formula 2K Mn = 361 | 60% |
| 12 | Formula 2L Mn = 564 | 25% |
| 13 | Formula 2M Mn = 544 | 36% |

Example 3

Using a compound of formula 2A as the low molecular weight compound, a series of mixtures were made up with high molecular weight compounds of general Formula 11A having progressively increasing molecular weight. The mixtures were 50:50 parts by weight. The results are shown in FIG. 1. Mixtures with a compound 11A of mol. wt.=2000-3000 or less have impaired mobility compared with the single component. However, for mol. wt. ~5000 or greater there is a substantial increase in the mobility of the mixture compared with the high molecular weight component on its own.

Examples 4 and 5

Figure 2:
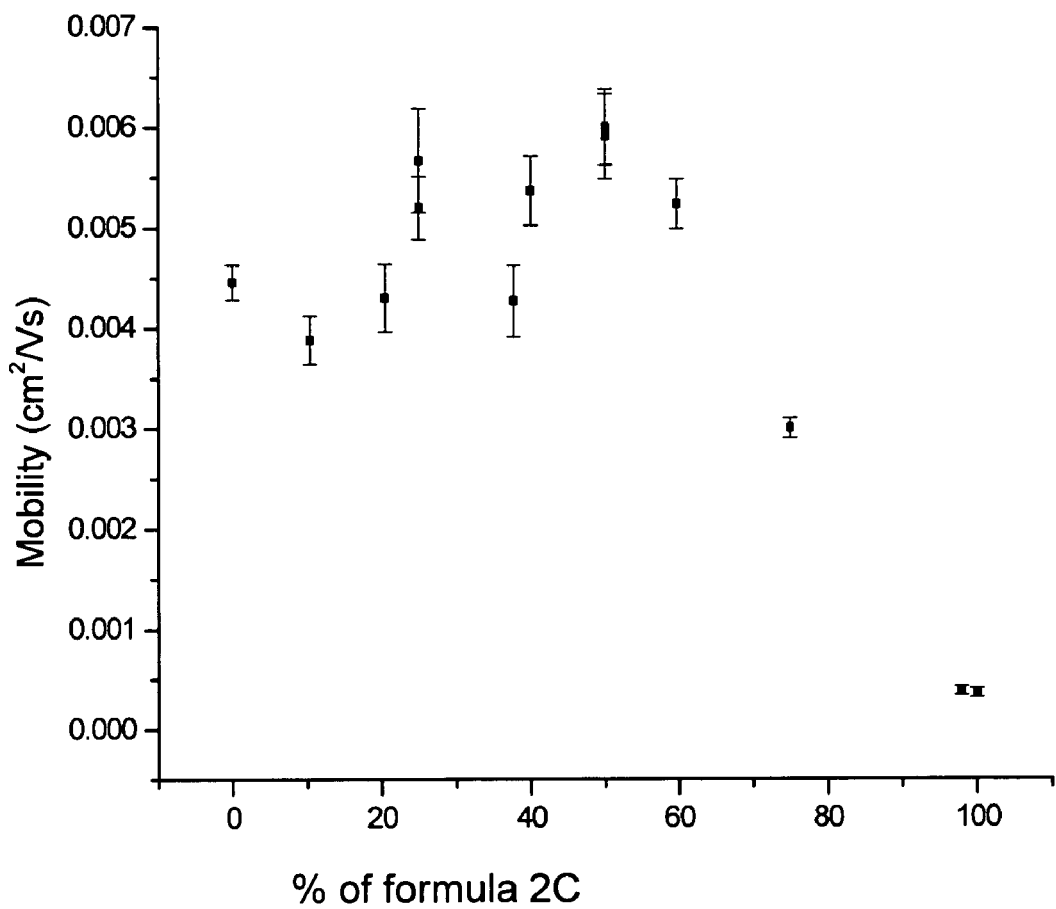
FIG. 2 shows charge carrier mobility of mixtures according to Example 4.
Figure 3:
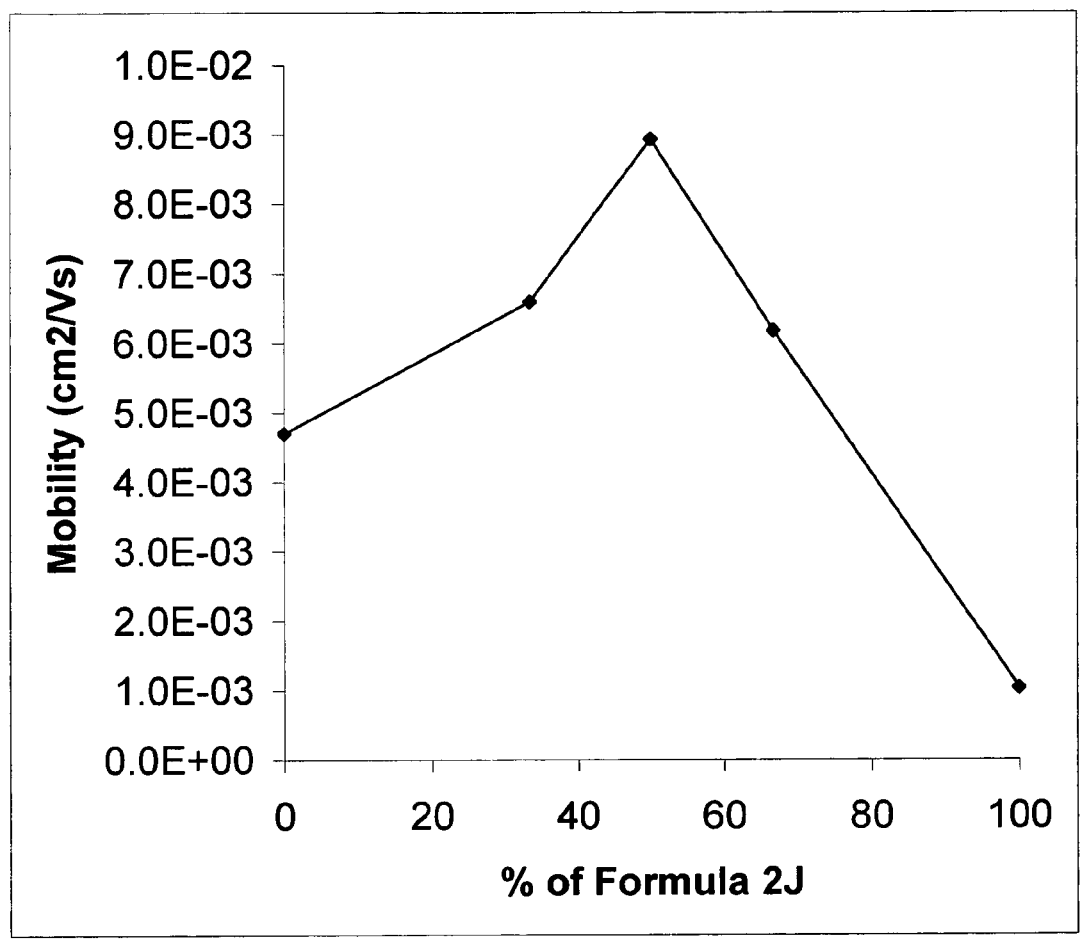
FIG. 3 shows charge carrier mobility of mixtures according to Example 5.

The variation of the mobility with mixing ratio of the high and low molecular weight compounds was investigated. A high weight compound of Formula 11A (Mn=17300) was mixed with a low weight compound of formula 2C at various mixing ratios (example 4). The results are shown in FIG. 2. The experiment was repeated using a different low molecular weight compound, this time a compound of formula 2J (example 5) and the results are shown in FIG. 3. It can be seen that the biggest mobility increases occur when the mixing ratio is in the range 40:60-60:40 parts by weight, especially at a ratio of about 50:50.

Comparative Example 1

Mixtures 14 & 15 not in accordance with the present invention were made from the high molecular weight and low molecular weight compounds listed in Table 3 (50:50 parts by weight). The mobilities of the resultant mixtures and the percentage change when compared with the high molecular weight compound on its own are given. The mobilities of the mixtures were found to be lower than the components on their own.

TABLE 3

| Mixture no. | High mol. wt. compound (mobility, cm²/V·s) | Low mol. wt compound (mobility, cm²/V·s) | Mobility of mixture | % change in mobility* |
|---|---|---|---|---|
| 14 Comparative | Formula 11A, Mn = 2500 ($2.3 \times 10^{-3}$) | Formula 2A, Mn = 514 ($3.7 \times 10^{-4}$) | $1.1 \times 10^{-3}$ | −52 |
| 15 Comparative | Formula 11B, Mn = 2100 ($4.1 \times 10^{-3}$) | Formula 2A, Mn = 514 ($3.7 \times 10^{-4}$) | $2.9 \times 10^{-3}$ | −30 |

Example 6

Mixtures 16 & 17 were made from the high molecular weight and low molecular weight compounds listed in Table 4 (50:50 parts by weight). These tests were performed using chlorobenzene as a solvent for the organic semiconductor mixture. The dielectric used was polyisobutylene (Acros cat. No 29916-1000) spun from a solution in hexane. The mobility was determined using a gate potential of up to −60V instead of −40V as the dielectric thickness was greater than in the earlier examples. The mobilities of the resultant mixtures are given, together with the % increase over the single component. It can be seen that substantial mobility increases are obtained with the mixtures.

TABLE 4

| Mixture no. | High mol. wt. compound (mobility, cm²/V·s) | Low mol. wt compound (mobility, cm²/V·s) | Mobility of mixture | % increase in mobility* |
|---|---|---|---|---|
| 16 | Formula 11C, Mn = 50,000 ($3.0 \times 10^{-3}$) | Formula 2J, Mn = 359 ($1.0 \times 10^{-3}$) | $4.8 \times 10^{-3}$ | 60 |
| 17 | Formula 11C, Mn = 50,000 ($3.0 \times 10^{-3}$) | Formula 2O, Mn = 345 (not possible to measure mobility on its own due to crystalline nature of film) | $4.4 \times 10^{-3}$ | 47 |

Example 7

Mixtures 18 & 19 were made from the high molecular weight and low molecular weight compounds listed in Table 5 (50:50 parts by weight), using the method of Example 6 above, except that in the case of mixture 18, the dielectric was CYTOP spun from a solution in toluene. The PIB dielectric in mixture 19 was spun from toluene. Measurements were carried out as in the above Example 6. The mobilities of the resultant mixtures are given in Table 5, together with the % increase over the single component. It can be seen that substantial mobility increases are again obtained with the mixtures. The high molecular weight compounds in this case were copolymers (formulae 12A and 12B below).

TABLE 5

| Mixture no. | High mol. wt. compound (mobility, $cm^2/V \cdot s$) | Low mol. wt compound (mobility, $cm^2/V \cdot s$) | Mobility of mixture ($cm^2/V \cdot s$) | % increase in mobility |
|---|---|---|---|---|
| 18 | Formula 12A, $M_n = 8200$ $(7.3 \times 10^{-4})$ | Formula 2C $(1.7 \times 10^{-3})$ | | 133 |
| 19 | Formula 12B, $M_n = 17900$ $(2.8 \times 10^{-3})$ | Formula 2J $(4.7 \times 10^{-3})$ | | 68 |

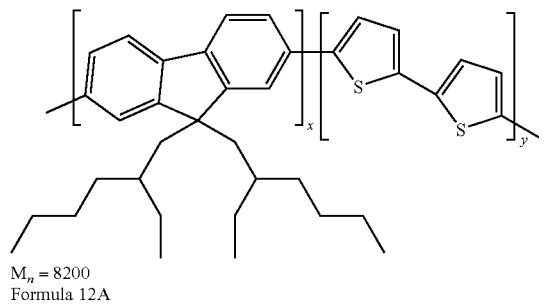

$M_n = 8200$
Formula 12A

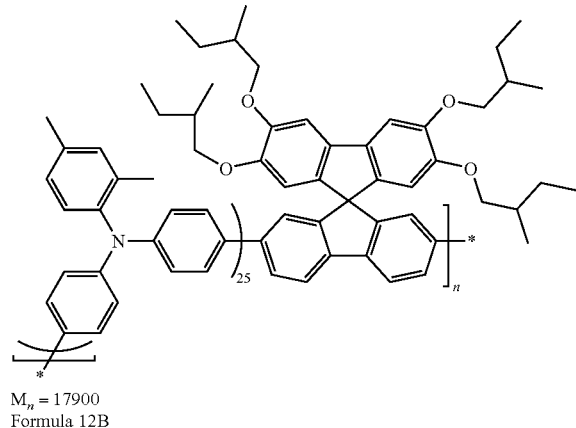

$M_n = 17900$
Formula 12B

The invention claimed is:

1. A composition comprising: (i) at least one higher molecular weight organic semiconducting compound having a number average molecular weight (M) of at least 5000, and (ii) at least one lower molecular weight organic semiconducting compound having a number average molecular weight (M) of 1000 or less, whereby the composition functions as a organic semiconducting material, and wherein both the higher and lower molecular weight semiconducting compounds are present in the composition in the relative proportions 30:70-70:30 parts by weight, and at least the higher molecular weight semiconducting compound has a charge carrier mobility, μ, of at least $10^{-4}$ $cm^2/V.s$.

2. A composition as claimed in claim 1 wherein the M of the higher molecular weight semiconducting compound is at least 7000.

3. A composition as claimed in claim 2 wherein the M of the lower molecular weight semiconducting compound is at least 150.

4. A composition as claimed in claim 1 wherein both the higher and lower molecular weight semiconducting compounds have a charge carrier mobility, μ, of at least $10^{-4}$ $cm^2/V.s$.

5. A composition as claimed in claim 1 wherein said charge carrier mobility, μ, is at least $10^{-4}$ $cm^2/V.s$.

6. A composition as claimed in claim 1 wherein the lower molecular weight semiconducting compound comprises either an oligomer having a number of repeat units, n, in the range 2-5, or a non-oligomeric molecule where n=1.

7. A composition as claimed in claim 6 wherein the lower molecular weight semiconducting compound contains one or more of arylamine, fluorene, and/or thiophene groups.

8. A composition as claimed in claim 7 wherein the lower molecular weight semiconducting compound has a Formula 1:

Formula 1 wherein $Ar^1$, $Ar^2$ and $Ar^3$, which may be the same or different, each represent, independently if in different repeat units, an aromatic group (mononuclear or polynuclear) optionally substituted by at least one optionally substituted $C_{1-40}$ hydrocarbyl group and/or at least one other optional substituent and n=1 to 4.

9. A composition as claimed in claim 1 wherein the higher molecular weight semiconducting compound comprises a conjugated polymer.

10. A composition as claimed in claim 9 wherein the higher molecular weight semiconducting compound comprises a polymer being either a homo-polymer or copolymer, including a block-copolymer, containing one or more of arylamine, fluorene, thiophene and/or optionally substituted aryl groups.

11. A composition as claimed in claim 10 wherein the polymer is a homo-polymer or copolymer, including a block-copolymer, containing arylamine and/or fluorene units.

12. A composition as claimed in claim 10 wherein the polymer is a homo-polymer or copolymer, including block-copolymer, containing fluorene and/or thiophene units.

13. A composition as claimed in claim 10 wherein the polymer is an arylamine group containing polymer having a Formula 11 wherein Formula 11 is the same as Formula 1 except that n is at least 5.

14. A composition as claimed in claim 13 wherein n is at least 20.

15. A composition as claimed in claim 1 wherein the higher and lower molecular weight semiconducting compounds each contain one or more of the following groups in common: arylamine, fluorene and/or thiophene.

16. A composition as claimed in claim 15 comprising at least one compound of Formula 1 where n=1 or 2 as the lower molecular weight compound and at least one compound of Formula 11 where n is at least 20 as the higher molecular weight compound.

17. A composition as claimed in claim 1 further comprising a binder resin.

18. In an electronic device containing an organic semiconducting material, the improvement wherein the organic semiconducting material is a composition according to claim 1.

19. An electronic device, containing a layer comprising a composition according to claim 1.

20. A device as claimed in claim 19 wherein the layer is deposited on a part of the electronic device by solution coating.

21. A device as claimed in claim 19 wherein the layer is deposited on a part of the electronic device by one of the following coating or printing techniques: dip coating, roller coating, reverse roll coating, bar coating, spin coating, gravure coating, lithographic coating (including photolithographic processes), ink jet coating (including continuous and drop-on-demand, and fired by piezo or thermal processes), screen coating, spray coating and/or web coating.

22. A device as claimed in claim 19 wherein the layer is deposited by first depositing one of the higher and lower molecular weight compounds followed by depositing the other of the higher and lower molecular weight compounds and allowing the higher and lower molecular weight compounds to diffuse into each other to form the composition.

23. A device as claimed in claim 19 wherein the layer is used as a semiconducting layer in one of the following electronic devices: field effect transistor (FET), organic light emitting diode (OLED), photodetector, chemical detector, photovoltaic cell, capacitor or memory.

24. A device as claimed in claim 19 wherein the layer is used as a semiconducting layer in a field effect transistor (FET).

25. In an electrophotographic apparatus containing an organic semiconducting material, the improvement wherein the organic semiconducting material is a composition according to claim 1.

26. In an electronic device containing an organic semiconducting materials, the improvement wherein the organic semiconducting material is a composition according to claim 1.

27. A composition according to claim 1, wherein the higher and lower molecular weight semiconducting compounds each contain one or more of the following groups in common: arylamine, fluorine and/or thiophene groups.

* * * * *